US006635936B1

(12) United States Patent
Wuu et al.

(10) Patent No.: US 6,635,936 B1
(45) Date of Patent: Oct. 21, 2003

(54) SRAM LAYOUT FOR RELAXING MECHANICAL STRESS IN SHALLOW TRENCH ISOLATION TECHNOLOGY

(75) Inventors: Shou-Gwo Wuu, Chu-Tung (TW); Jin-Yuan Lee, Hsin-Chu (TW); Dun-Nian Yaung, Taipei (TW); Jeng-Han Lee, Kinmen (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/616,975

(22) Filed: Jul. 14, 2000

Related U.S. Application Data (62) Division of application No. 09/252,464, filed on Feb. 18, 1999, now Pat. No. 6,117,722.

(51) Int. Cl.[7] .......................... H01L 29/76; H01L 27/11
(52) U.S. Cl. ....................... 257/379; 257/382; 257/401; 257/903
(58) Field of Search ................... 257/67, 69, 379–385, 257/903, 904, 401

(56) References Cited

U.S. PATENT DOCUMENTS 5,466,632 A     11/1995   Lur et al. ..................... 437/69
5,698,893 A  *  12/1997   Perera et al. ................ 257/627
5,866,449 A  *   2/1999   Liaw et al. .................. 438/238
6,172,387 B1 *   1/2001   Thakur et al. ............... 257/296
6,271,542 B1 *   8/2001   Emma et al. .................. 257/67

FOREIGN PATENT DOCUMENTS

JP         2000-91448       *  3/2000

* cited by examiner

Primary Examiner—Ori Nadav
(74) Attorney, Agent, or Firm—George O. Saile; Stephen B. Ackerman; Graham S. Jones, II

(57) ABSTRACT

An SRAM device has STI regions separated by mesas and doped regions including source/drain regions, active areas, wordline conductors and contacts in a semiconductor substrate is made with a source region has 90° transitions in critical locations. Form a dielectric layer above the active areas. Form the wordline conductors above the active areas transverse to the active areas. The source and drain regions of a pass gate transistor are on the opposite sides of a wordline conductor. Form the sidewalls along the <100> crystal plane. Form the contacts extending down through the dielectric layer to the mesas. Substrate stress is reduced because the large active area region formed in the substrate assures that the contacts are formed on the <100> surfaces of the mesas are in contact with the mesas formed on the substrate and that the <110> surfaces of the silicon of the mesas are shielded from the contacts.

24 Claims, 5 Drawing Sheets

SRAM LAYOUT FOR RELAXING MECHANICAL STRESS IN SHALLOW TRENCH ISOLATION TECHNOLOGY

This is a division of patent application Ser. No. 09/252,464, filing date Feb. 18, 1999, now U.S. Pat. No. 6,117,722 SRAM Layout For Relaxing Mechanical Stress In Shallow Trench Isolation Technology Andmethod Of Manufacture Thereof, assigned to the same assignee as the present invention.

BACKGROUND OF THE INVENTION 1. Field of the Invention

This invention relates to semiconductor memory devices and more particularly to the configuration of SRAM memory devices. 2. Description of Related Art Mechanical stress has been a problem which has existed in Shallow Trench Isolation (STI) technology. Mechanical stress tends to induce crystal defects which will result in creating leakage paths. It is necessary that such leakage paths should be suppressed to improve yield.

In U.S. Pat. No. 5,466,632 of Lur et al. a FOX region with curvilinear boundaries is employed to reduce stress.

SUMMARY OF THE INVENTION

In accordance with this invention, 90 degree transitions are employed at critical locations, while using 45 degree transition as few times as possible, where STI technology is used in an SRAM layout.

Problems which are solved by the present invention are as follows:
1. Leakage is decreased by reduction of crystal defects.
2. Large contact (CO)/active area (AA) extension reduces the difficulties associated with photolithographic misalignment.
3. The contact etch window is increased because no stop layer (such as a silicon nitride stop layer) is required to be employed.

In accordance with this invention, a method of forming a layout for an SRAM device is provided having doped regions including a source region, a drain region, and active areas, a wordline conductor and contacts. First form a layout of at least one source/drain region in a doped semiconductor substrate with 90° transitions in critical locations where a source/drain region is to be formed; form a dielectric layer above the active areas; form the wordline conductor above the active areas transverse to the active areas, and form source regions in the critical locations in the active areas juxtaposed with the wordline conductor to form pass gate transistors while simultaneously forming drain regions in the active areas juxtaposed with the wordline conductor on the opposite side from the source regions to form pass gate transistors, forming the sidewalls along the <100> crystal plane. Then, form the contacts to the source/drain regions formed between the wordline conductor extending down through to the dielectric layer to the source/drain regions. Substrate stress is reduced because the large active area region formed in the substrate assures that the contacts are formed on the <100> surfaces of the mesas are in contact with the mesas formed on the substrate and that the <110> surfaces of the silicon of the mesas are shielded from the contacts.

In accordance with another aspect of this invention, an SRAM device with a preferred layout having source regions, drain regions, active areas, a wordline conductor and contacts. Regions are formed in a doped silicon semiconductor substrate with 90° transitions in critical locations where source regions are to be formed. A dielectric layer is formed above the active areas. The wordline conductor is composed of doped polysilicon formed above the active areas transverse to the active areas. Source regions are formed in the critical locations in the active areas juxtaposed with the wordline conductor to form pass gate transistors while simultaneously formed drain regions in the active areas juxtaposed with the wordline conductor on the opposite side from the source regions to form pass gate transistors. The source region sidewalls are formed along the <100> crystal plane. The contacts to the drain regions formed between the wordline conductor extending down through to the dielectric layer to the drain regions. The source regions and the drain regions have similar sizes and shapes. Once again, substrate stress is reduced because the large active area region formed in the substrate assures that the contacts are formed on the <100> surfaces of the mesas are in contact with the mesas formed on the substrate and that the <110> surfaces of the silicon of the mesas are shielded from the contacts.

BRIEF DESCRIPTION OF THE DRAWINGS

The foregoing and other aspects and advantages of this invention are explained and described below with reference to the accompanying drawings, in which.

DESCRIPTION OF AN EMBODIMENT WITH <110> PLANE MECHANICAL STRESS

Figure 1A:
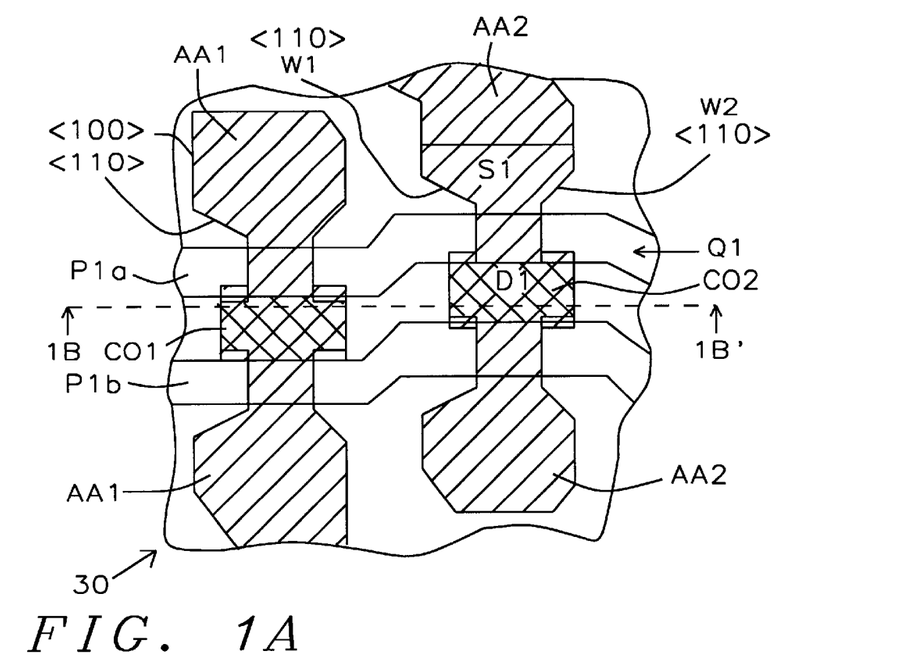
FIG. 1A shows a plan view of a portion of a first design considered for an SRAM design layout.
Figure 1B:
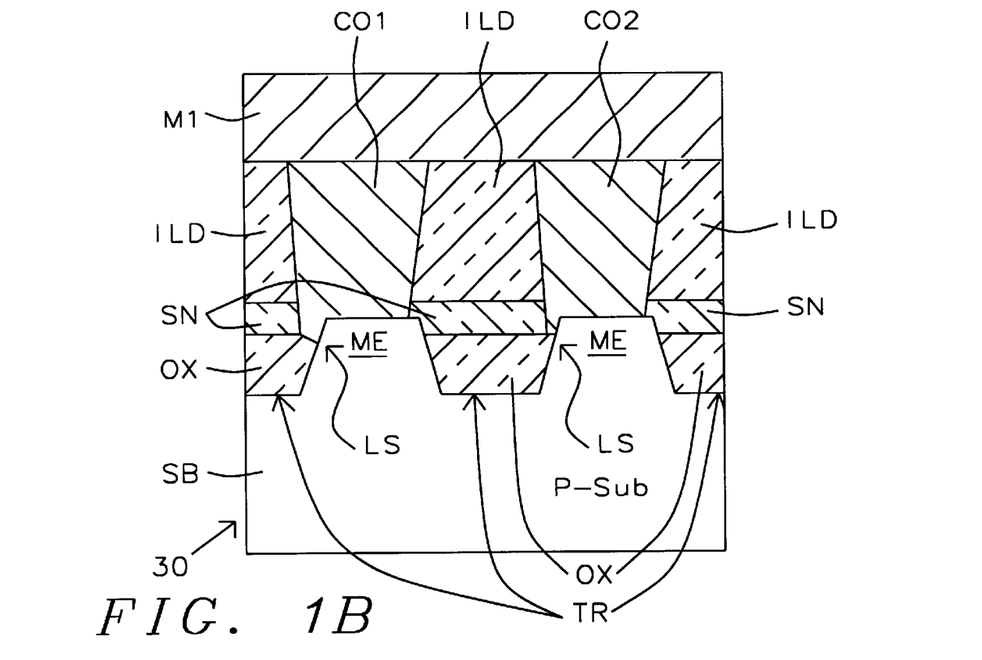
FIG. 1B shows a sectional, elevational view taken along line 1B–1B' in FIG. 1A.

FIG. 1A shows a plan view of a portion of a first design considered for use as an SRAM design layout which has been found to have a problem of leakage paths. FIG. 1B shows a sectional, elevational view taken along line 1B–1B' in FIG. 1A. The device 30 which includes an SRAM is formed on a P– doped silicon substrate SB.

Referring to FIG. 1A the device 30 includes two vertically extending active areas AA1/AA2, two horizontally extending word lines P1a and P1b composed of a conventional polysilicon 1 metallization layer. Word lines P1a and P1b include the gate electrodes of pass gate transistors Q1 and Q2 in FIG. 3. The contacts CO1 and CO2 are located between the word lines P1a and P1b extending down to active areas AA1/AA2 respectively. Source region S1 and drain region D1 (formed in P− doped silicon substrate SB) are shown above and below the word line P1a in FIG. 1A in the active area AA2. The drain region D1 is square and the source region S1 is smaller and has 45° diagonal walls W1 and W2 diverging away to a wider active area AA2 on the top of FIG. 1A which are formed along the <110> oriented plane in the silicon substrate 32.

Referring to FIG. 1B, a plurality of trenches TR and mesas ME have been formed in the surface of the P− doped silicon semiconductor substrate SB. The trenches TR have been filled with silicon dioxide STI regions OX. Between the trenches TR are two separate mesas ME of P− substrate SB formed during the formation of the adjacent trenches. The mesas ME serve as contact regions for the contacts CO1 and CO2 which are superjacent to and in contact with the tops of mesas ME.

Processing for Device of FIGS. 1A and 1B
1.1 Substrate with STI Regions between Mesas
A process of forming the device of FIGS. 1A and 1B involves starting with the P− substrate SB filled with silicon dioxide STI regions OX with mesas ME therebetween.
1.2 Silicon Nitride Layer
Next, a blanket silicon nitride layer SN was formed over the mesas ME and partly over the STI regions OX.
1.3 ILD Layer
Next, a blanket InterLayer Dielectric (ILD) glass layer ILD was formed covering the silicon nitride layer SN.
1.4 Contact Openings Over Mesas
In the next step in the manufacturing process to produce the devices shown in FIGS. 1A and 1B, contact openings are etched through the glass layer ILD. Although the contact openings were intended to be centered over the mesas ME between the STI regions OX, and despite attempts to center the contact openings over the mesas ME between the STI regions OX, as shown by FIG. 1B, the openings are substantially off-center with respect to the mesas ME as indicated by the location of contacts CO1 and CO2 in FIG. 1B. Since the contact holes are off-center with respect to the mesas ME in FIG. 1B, the sidewalls of the mesas ME were partially exposed (which exposes the <110> oriented plane to contacts CO1 and CO2 as described next).
1.5 Contacts Made to Mesas
Next, for producing the devices shown in FIGS. 1A and 1B, conventional contact metallization was deposited into the contact openings formed during step 1.4 to form the contacts CO1 and CO2 deposited in the contact openings. As a result the two mesas ME are connected mechanically and electrically to contacts CO1 and CO2.

There is a problem that the alignment of the contact holes formed during step 1.4 in the process of FIGS. 1A and 1B, leaves the thin silicon nitride layers SN above the STI oxide regions OX misaligned with the mesas ME. As seen in FIG. 1B, the contact holes expose the upper left edges of the mesas ME (substrate SB) exposed which form "rounded" surfaces of the mesas ME (substrate SB) on which contacts CO1 and CO2 are formed. We have found that the "rounded" surfaces of the mesa ME (substrate SB) are a problem, exposing the <110> oriented plane of the substrate SB thereby producing leakage sources LS seen in FIG. 1B in response to stress generated at the <110> oriented planes. That stress at the leakage sources LS forms leakage paths from the contacts CO1 and CO2 passing through the mesas ME (substrate SB) where the <110> oriented plane surfaces of the substrate are exposed.

To eliminate leakage paths and leakage sources LS, we have found that the exposure of the surfaces of the <110> oriented planes adjacent to the mesas ME should be minimized to minimize production of stress in the mesas ME. Moreover, we have found that orthogonal lines formed along the <100> oriented plane are more easily reproduced by photolithography. Also, it is easier to reproduce straight lines than to reproduce lines which are a combination of vertical, horizontal and diagonal lines that introduce surfaces of substrate SB with a <110> oriented plane exposed to the contacts CO1 and CO2.

In addition, after the active region photolithography and etching, the D1 region of device 30 as shown in FIG. 1A and 1B is "rounded" and much smaller than the original layout.

DESCRIPTION OF THE PREFERRED EMBODIMENT

Figure 2A:
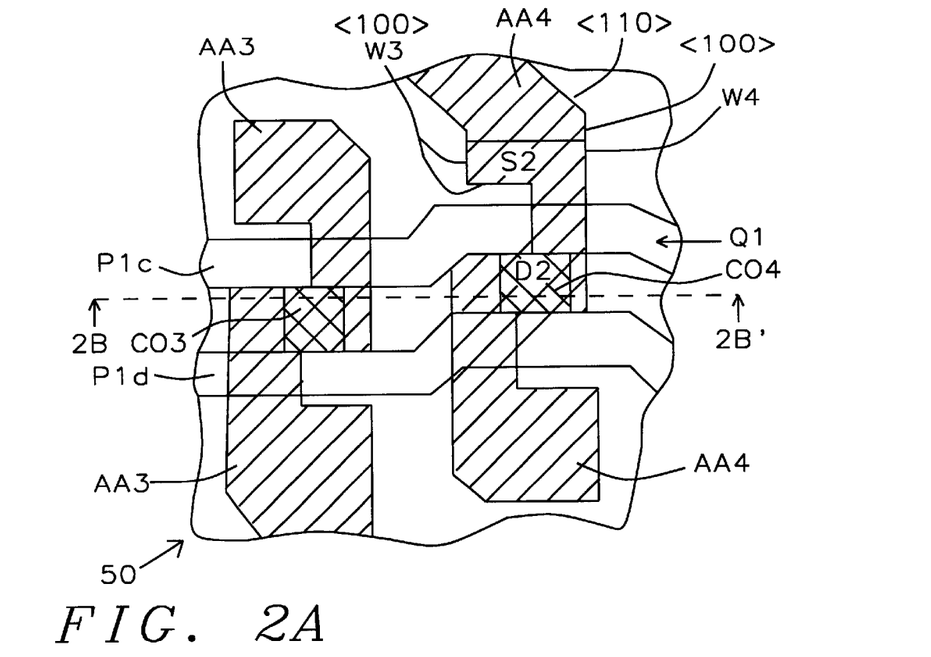
FIG. 2A shows a plan view of a portion of a first design considered for an SRAM design layout in accordance with this invention.
Figure 2B:
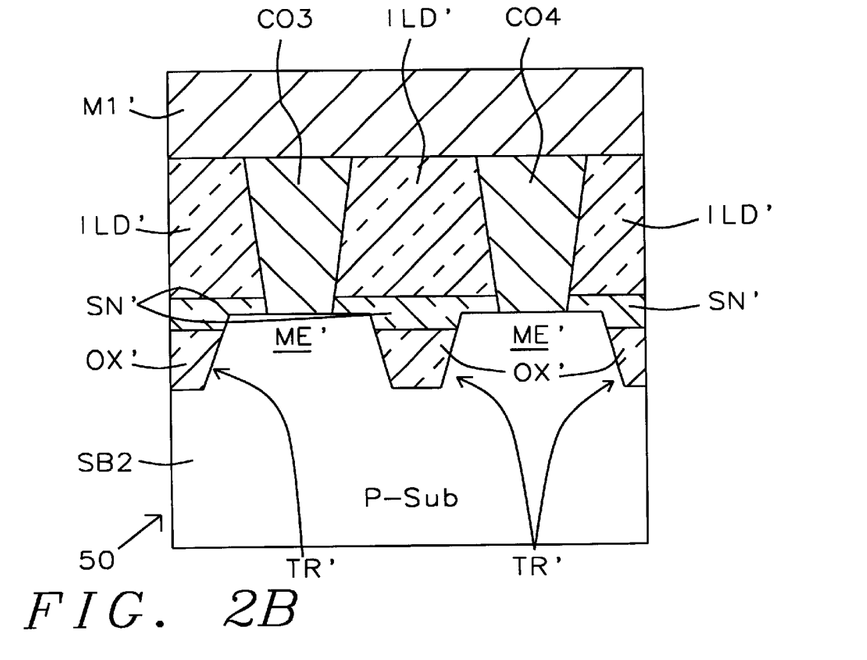
FIG. 2B shows a sectional, elevational view taken along line 2B–2B' in FIG. 2A.

FIG. 2A shows a plan view of a portion of a first design considered for an SRAM design layout in accordance with this invention which is a modification of the design shown in FIG. 1A. FIG. 2B shows a sectional, elevational view taken along line 2B–2B' in FIG. 2A. The device 50 which includes an SRAM is formed on a P− doped silicon substrate SB'.

Referring to FIG. 2A, a series of 90° transitions is employed in the profile of the active area at critical locations W3/W4, such as the sidewalls of the source regions of the pass gate transistors Q1/Q2. The set of 90° transitions maximizes the <100> oriented planes and minimizes the <110> oriented plane along the sidewalls of the regions, where such criticality exists. This contrasts with FIG. 1A with the 45° diagonal walls W1 and W2 diverging away to a wider active area AA2.

Referring again to FIG. 2A the device 50 includes two active areas AA3/AA4, which extend vertically; two horizontally extending word lines P1c and P1d (formed of polysilicon 1 metallization). Word lines P1c and P1d serve as the gate electrodes of pass gate transistors Q1 and Q2 in FIG. 3. Contacts CO3 and CO4 are located between word lines P1c and P1d extending down to the active areas AA3/AA4 respectively. Source region S2 and drain region D2 (formed in P− doped silicon substrate SB2) are shown above and below the word lines P1c in FIG. 2A in the active area AA4. The drain region D21 is square and the source region S2 is also square. The orthogonal walls W3 and W4 in FIG. 2A are formed along <100> oriented planes in the silicon substrate SB2, as contrasted with the 45° diagonal walls W1 and W2 of FIG. 1A.

Referring to FIG. 2B, a plurality of trenches TR' have been formed in the surface of P− doped silicon semiconductor substrate SB2. The trenches TR' have been filled with silicon dioxide STI trench isolation regions OX'. Between the trenches TR' are two separate mesas ME' of the P− substrate SB2 formed as the result of forming the adjacent trenches TR'. As can be seen the mesas ME' have sloping sidewalls juxtaposed with the STI trench isolation regions OX' with the "rounded" corner surfaces described above where the flat tops of the mesas ME' intersect with the sloping sidewalls of the mesas ME'. The flat top surfaces of the Mesas ME' serve as contact regions for the lower ends of contacts CO3 and CO4 which are formed superjacent to the mesas ME', i.e. on the top surfaces of mesas ME'. From a different point of view, the silicon dioxide STI regions OX' separate the mesas ME' of the substrate SB2. The mesas ME' are formed in the silicon substrate SB2 between the silicon oxide STI trench isolation regions OX'. The contacts CO3 and CO4 are aligned with the central portions of the flat upper surfaces of the mesas ME' and therefore are isolated from the <110> silicon (Si) plane of the substrate SB2.

A process of forming the device of FIGS. 2A and 2B involves starting with the P− substrate SB2 filled with silicon dioxide STI regions OX' with mesas ME' with the sloping sidewalls therebetween. The STI regions OX' are formed in a conventional manner.

2.2 Silicon Nitride Layer

After the STI regions OX' and mesas ME' were formed the substrate SB2, a blanket silicon nitride layer SN' was formed covering the mesas ME' and the STI regions OX'. The silicon nitride layer SN' was formed by LPCVD or PECVD to a thickness between about 600 Å and 1,000 Å.

2.3 ILD Layer

Next, a blanket InterLayer Dielectric (ILD) glass layer ILD' was formed covering the silicon nitride layer SN'. The InterLayer Dielectric (ILD) glass layer ILD' is composed of undoped plasma enhanced TEOS (PETEOS) silicon dioxide. The glass layer ILD' is deposited to a thickness between 1000 Å and 2000 Å using tetraethylorthosilicate (TEOS) as a source followed by an overlying layer of BPSG (Boro-PhosphoSilicate Glass) deposited to a thickness between 3,000 Å and 12,000 Å. Then, the glass layer ILD is annealed.

2.4 Contact Openings Over Mesas

In the next step in the manufacturing process for producing the devices shown in FIGS. 2A and 2B, contact openings are etched through the glass layer ILD'.

First a conventional type of photoresist mask (not shown) is formed and contact openings through the glass layer ILD' are etched through openings in the mask. (The openings in the mask extend down to top surface of the glass layer ILD').

Then contact openings are etched through the layer ILD'. The contact openings are aligned well centered over the central portions of the flat upper surfaces of the mesas ME' between the STI' regions OX', as shown by FIG. 2B with substantial margins to the left and to the right so that they are isolated from the <110> silicon (Si) plane of the substrate SB2. The on-center openings are indicated by the location of contacts CO3 and CO4 in FIG. 2B on the centers of the top surfaces of the mesas ME'. Since the contact holes are on-center with respect to the mesas ME' in FIG. 2B, the sidewalls of the mesas ME' are protected (which protects the <110> oriented plane from contacts CO3 and CO4, as described next).

Above the STI oxide regions OX', the contact openings through the thin silicon nitride layers SN' are aligned with and overlapping the surfaces of the mesas ME' leaving the upper edges of the mesas ME' protected from exposure of "rounded" surfaces of the substrate SB2 to the contacts CO3 and CO4, thereby assuring that the contacts CO3 and CO4 will be isolated from the <110> silicon (Si) plane of the substrate SB2.

During processing, the contact openings are etched through the mask and through the layer ILD' by an etching method using an anisotropic, dry RIE process using $CHF_3$ gas as an etchant.

The openings etched through the layer ILD' are centered over the mesas ME' between the STI regions OX', unlike the openings in FIG. 1A.

Next, for producing the devices shown in FIGS. 2A and 2B, conventional contact metallization was deposited into the contact openings formed during step 2.4 to form the contacts CO3 and CO4 deposited in the contact openings. As a result the central portions of the flat upper surfaces of the two mesas ME' are connected mechanically and electrically to both of the contacts CO3 and CO4 and are isolated from the <110> silicon (Si) plane of the substrate SB2.

The layout of STI regions OX' is located along the <100> silicon (Si) plane. This eliminates what would be a potential cause of formation of leakage sources from the contacts CO3 and CO4. In other words the <110> oriented plane surfaces of the mesas ME' of substrate SB2 are protected from exposure to the contacts CO3 and CO4 thereby eliminating a possible cause of a leakage problem.

Circuit & Cell Layout

Figure 3:
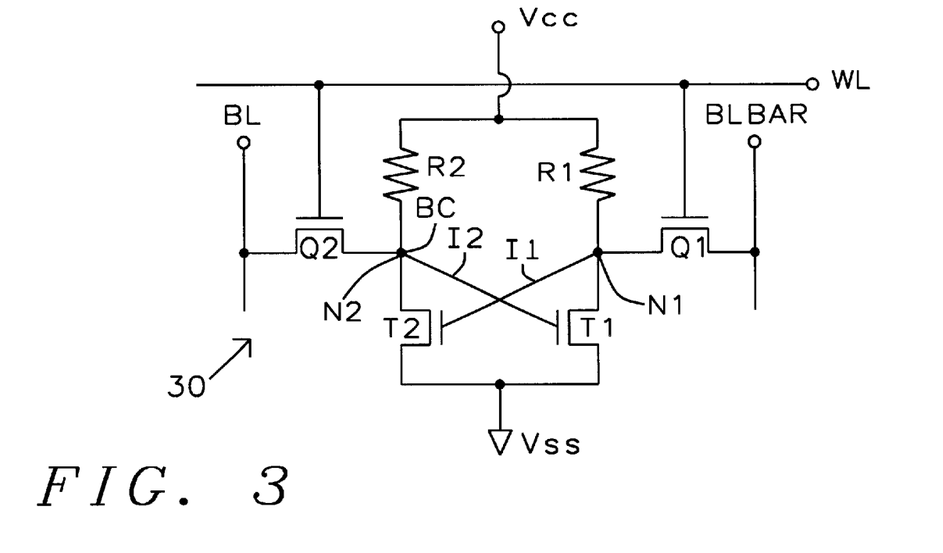
FIG. 3 shows a electrical schematic circuit diagram of an SRAM device of FIGS. 1A, 1B, 2A and 2B showing a cell layout for the SRAM circuit in accordance with the embodiment of this invention found in FIGS. 2A and 2B.

FIG. 3 shows a electrical schematic circuit diagram of an SRAM device of FIGS. 1A, 1B, 2A and 2B which shows the cell layout for the SRAM circuit in accordance with this invention. In FIG. 3, a voltage Vcc is connected to the top ends of pull up resistors R1/R2 which have been formed from the third polysilicon conductor layer P3, where the dopant levels are lower. The bottom end of the right pull up resistor R1 is connected to node N1 which is connected through to the drain/source circuit of FET pull down FET transistor device T1 to ground potential Vss. The bit line BLBAR is connected through the source/drain circuit of FET, pass transistor device Q1 to node N1. Node N1 connects to the common drains of transistors T1 and Q1.

The bottom end of the left pull up resistor R2 is connected to node N2/BC which is connected through to the drain/source circuit of pull down FET transistor device T2 to ground potential Vss. The bit line BL is connected through the source/drain circuit of FET, pass transistor device Q2 to node N2/BC. Node N2 connects to the common drains of transistors T2 and Q2 and the butted contact BC.

The word line (row select) is formed form the first polysilicon layer PS1 and is connected to the gate electrodes of the pass transistors Q1/Q2. The node N1 is connected via interconnect line I1 to the gate electrode of pull down transistor T2. The node N2 is connected via interconnect line I2 to the gate electrode of pull down transistor T1. Ground potential Vss is connected to devices formed from the M1, CT, polysilicon 2 layer, and the SAC. The power supply potential Vcc is connected to devices formed from the M1, polysilicon 1 layer and polysilicon 3 layer. The location of transistors Q1 is seen in the plan view of the devices 30/50 seen in FIGS. 1A/2A.

Figure 4A:
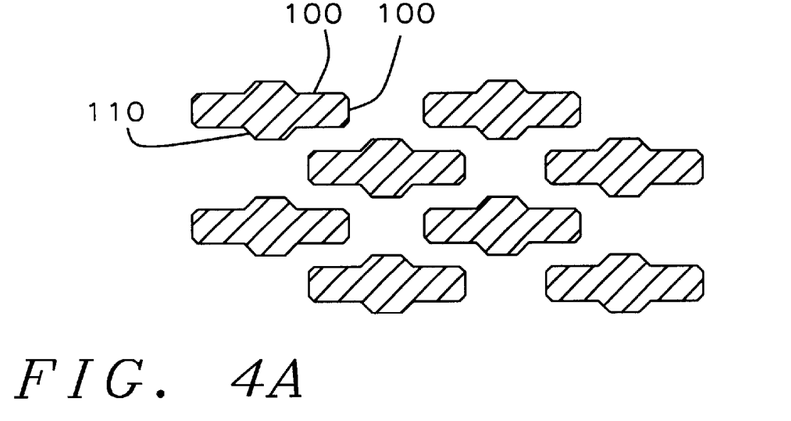
FIGS. 4A and 4B show two types of STI patterns. The Shallow Trench Isolation (STI) regions are unshaded, and the DRAM cell region is shown as the dashed box in FIG. 4B.
Figure 4B:
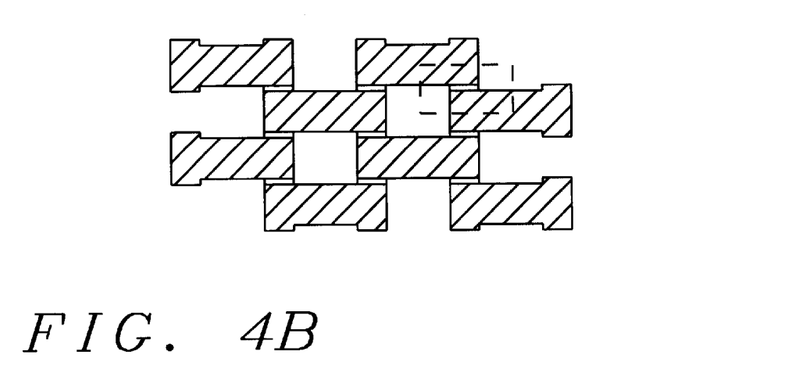

FIGS. 4A and 4B show two types of STI (Shallow Trench Isolation) patterns. Patterns in FIGS. 4A and 4B are referred below as type A and type B patterns, respectively. The shallow trench regions are unshaded, and the DRAM cell region is shown as the dashed box in FIG. 4B. Note that the oxidation rate on the <100> plane is faster than along the <110> plane.

FIGS. 5A–5D show the shear stress distribution when trench space width is narrowed while keeping line width constant. There are regions of varying stress distribution shown in FIGS. 5A–5D. Regions A are those areas in which the shear stress ranges between $0$–$5 \times 10^8$ dynes/cm$^2$. Regions A–F are provided as indicated by the shading in FIGS. 5A–5D.

An overall table of shear stress regions A–F is as follows:

| | SHEAR STRESS REGIONS |
|---|---|
| A | $0.0–5.0 \times 10^8$ dynes/cm$^2$ |
| B | $5.0–10.0 \times 10^8$ dynes/cm$^2$ |
| C | $10.0–15.0 \times 10^8$ dynes/cm$^2$ |
| D | $15.0–20.0 \times 10^8$ dynes/cm$^2$ |
| E | $20.0–25.0 \times 10^8$ dynes/cm$^2$ |
| F | $25.0–30.0 \times 10^8$ dynes/cm$^2$ |

Figure 5A:
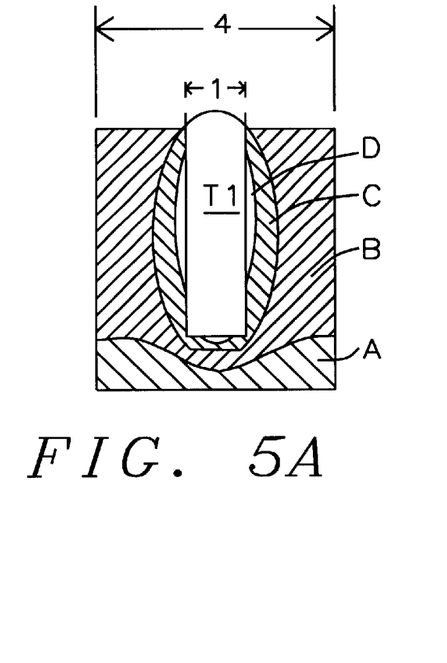
FIGS. 5A–5D show the shear stress distribution when trench space width is narrowed while keeping line width constant.

FIG. 5A shows an arrangement with a line width of about 1 μm with lateral space of about 3 μm on either side of the trench T1 for an overall width of about 4 μm. The stress is in range A at the base, B at the periphery of the sides, rising to C/D along the sidewalls of the trench T1.

Figure 5B:
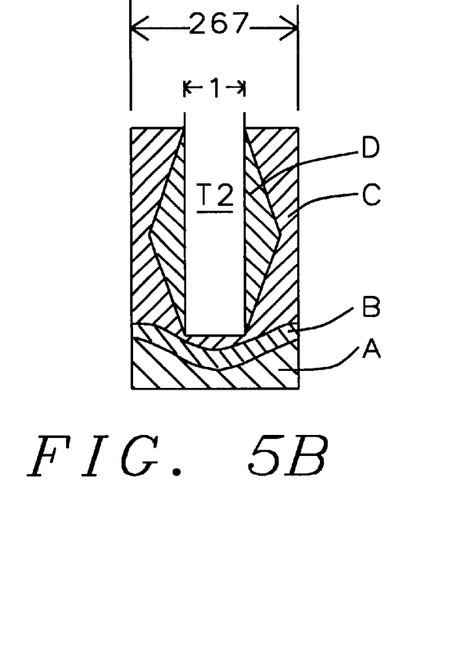

FIG. 5B shows an arrangement with a line width of about 1 μm with lateral space of about 1.67 μm on either side of the trench T2 for an overall width of about 2.67 μm. The stress is in ranges A/B at the base, C/D at the periphery of the sides along the sidewalls of the trench T2.

Figure 5C:
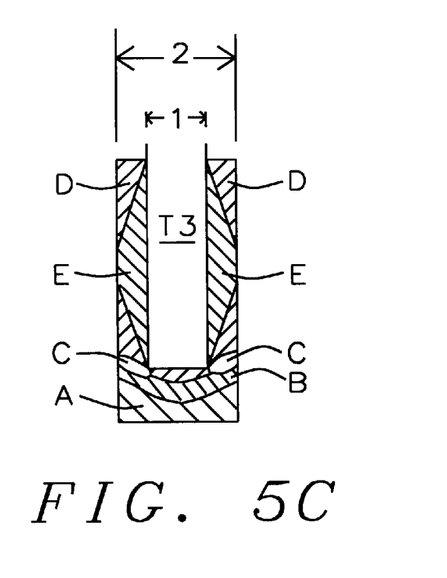

FIG. 5C shows an arrangement with a line width of about 1 μm with lateral space of about 1 μm on the sides of the trench T3 for an overall width of about 2 μm. The stress is in ranges A and B at the base, C at the base of the sides and D and E at the sidewalls of the trench T3.

Figure 5D:
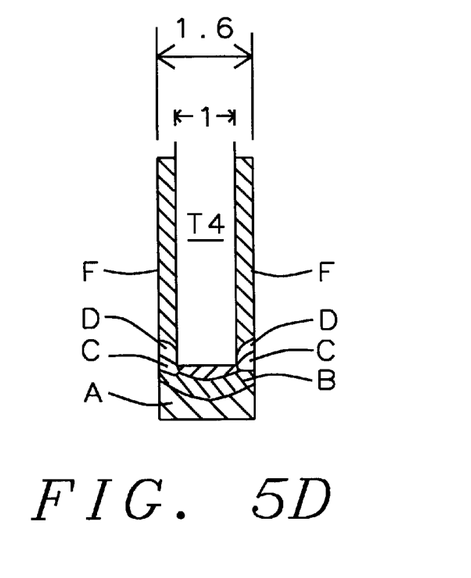

FIG. 5D shows an arrangement with a line width of about 1 μm with lateral space of about 0.6 μm on either side of the trench T4 for an overall width of about 2.6 μm. The stress is in ranges A, B and C at the base, D at the base of the sides and F along the sidewalls of the trench T4. The dark sectioning indicates the very much large space stress in the range from about 25–30 over almost the entire area shown for this very narrow space.

Figure 6:
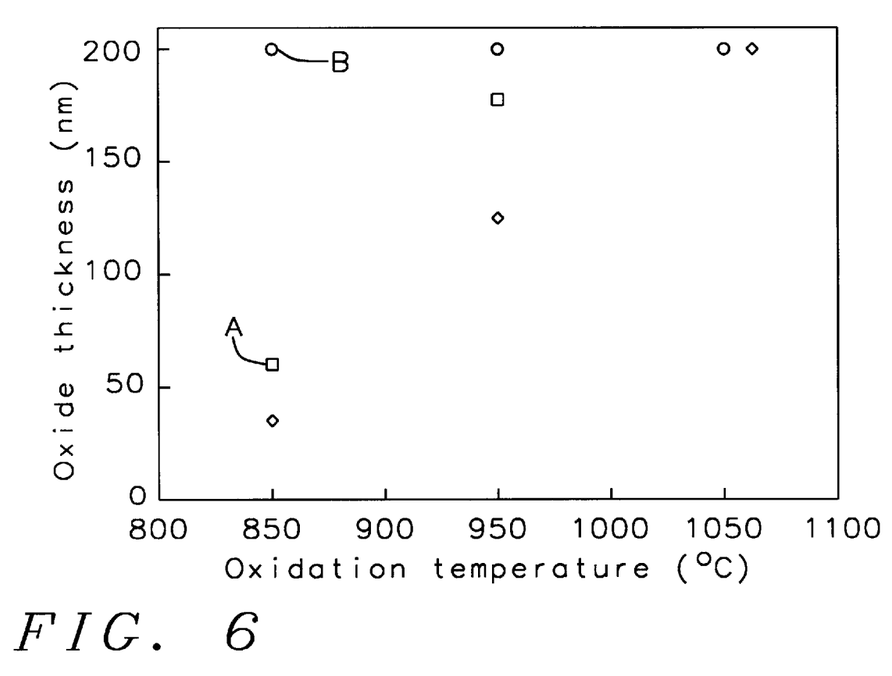
FIG. 6 is a chart of oxide thickness as a function of oxidation temperature illustrating the effect of pattern type on defect formation for various oxidation temperatures. The open circles correspond to data from FIG. 4B; the solid circles and squares correspond to data from FIG. 4A. Both sets of circles indicate that no defects were observed, while the squares indicate that multiple defects were observed in all cells.

FIG. 6 shows the oxide thickness (0 nm to 150 nm) as a function of oxidation temperature (800° C. to 1100° C.). The effect of pattern type on defect formation for various oxidation temperatures. The open circles correspond to data from Pattern B in FIG. 4B; the solid circles and squares correspond to data from Pattern A in FIG. 4A. Both sets of circles indicate that no defects were observed, while the squares indicate that multiple defects were observed in all cells. Note that the 200 nm thickness is the thickness at which oxide leads to crystal defects. The pattern in FIG. 4B has a higher immunity to crystal defect formation.

Figure 7A:
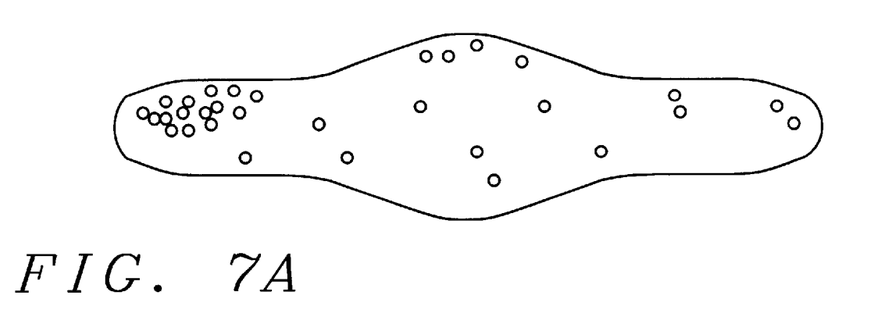
FIGS. 7A and 7B show the bright field, plan view transmission electron microscope of the silicon mesa pattern in FIG. 4A.
Figure 7B:
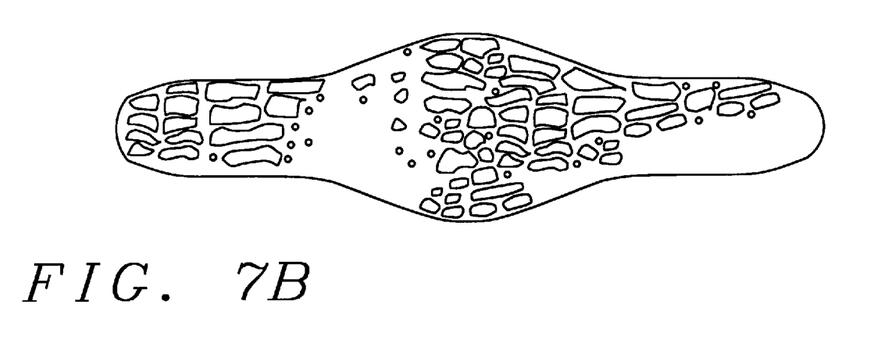

FIGS. 7A and 7B show the bright field, plan view transmission electron microscope of silicon mesa pattern type A in FIG. 4A. Samples were oxidized at 850° C. The results were as follows:

(a) No dislocations were present after forming of 38 nm of oxide.

(b) Increasing the oxidation time to grow 56 nm of oxide resulted in multiple dislocations throughout the mesa.

SUMMARY

In accordance with this invention, features of this invention are as follows:
1. The STI layout is located along the <100> silicon (Si) plane.
2. This layout shows high fidelity photolithography. The mask layout can be reproduced on a wafer with a low-encroachment effect.
3. The pass gate transistor has good symmetry in that the source region and the drain region areas are similar in size and shape as seen in the plan view, FIG. 2A.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A layout for an SRAM device having source regions drain regions formed in adjacent active areas in a doped semiconductor substrate, a first wordline conductor parallel to a second wordline conductor, and contacts comprising:

said active areas being formed in a doped semiconductor substrate with a layout with 90° transitions in the profile of the active area in critical locations where said source regions are formed, means formed in said silicon substrate between STI trench isolation regions filled with STI isolation material with each of said mesas having a flat top surface and sidewalls with said flat top having edges between said sidewalls and said flat top, a dielectric layer formed above said active areas covering said STI regions and covering said edges of said flat top surfaces of said mesas and covering said edges between said sidewalls and said flat tops of said mesas, said active areas crossing said first wordline conductor and said second wordline conductor at right angles thereto, with double back patterns including transverse regions of said active areas located between said first wordline conductor said second wordline conductor and with said transverse regions extending in parallel to said first wordline conductor said second wordline conductor where said active areas cross said first wordline conductor and said second wordline conductor, at least one of said first and second wordline conductors being formed above said active area transverse to said active area, a source region formed in said critical locations in said active areas juxtaposed with said wordline conductor forming pass gate transistors while simultaneously forming drain regions in said active areas juxtaposed with said wordline conductor on the opposite side from said source region to form a pass gate transistors, said source regions having sidewalls, said contacts being aligned with said mesas with lower ends of said contacts having a narrower width than the flat top surface of said mesas centered over said mesas and isolated from a <110> silicon (Si) plane of said substrate by the STI isolation material and the dielectric material covering the upper edges of the mesa and the upper edges of the sidewalls of the mesa, and at least one of said contacts to said drain region being formed extending down from one of said wordline conductors through said dielectric layer to said drain region.

2. The device of claim 1 wherein with respect to said layout, said sidewalls of said source regions are formed along the <100> crystal plane.

3. The device of claim 1 wherein:

said active areas cross said first wordline conductor and said second wordline conductor at right angles thereto, with double back patterns including transverse regions of said active areas located between said first wordline conductor said second wordline conductor, with said transverse regions extending in parallel to said first wordline conductor and said second wordline conductor where said active areas cross said first wordline conductor and said second wordline conductor.

4. The device of claim 3 wherein:

with respect to said layout, said source region sidewalls are formed along a <100> crystal plane, and said first wordline conductor and said second wordline conductor are formed of doped polysilicon.

5. The device of claim 3 wherein:

said doped semiconductor substrate comprises doped silicon, and with respect to said layout, sidewalls of said source regions and drain regions are formed along a <100> crystal plane.

6. The device of claim 1 wherein said active areas cross said first wordline conductor and said second wordline conductor at right angles thereto, with double back patterns including transverse regions of said active areas located between said first wordline conductor said second wordline conductor and with said transverse regions extending in parallel to said first wordline conductor said second wordline conductor where said active areas cross said first wordline conductor and said second wordline conductor, said active area includes a forward portion and a rear portion connected by a region parallel to said first wordline conductor and said second wordline conductor between said first wordline conductor and said second wordline conductor, with said double back pattern of said active area comprising a horizontally extending crossing region at the location of the contact with the active area doubling back between the word line conductor and the second wordline conductor, thereby connecting the forward and rear portions of the active areas to complete the double back pattern.

7. An SRAM device with a preferred layout having source/drain regions formed in active areas, a pair of parallel wordline conductors and a contact to said source/drain regions, said device comprising:

said source/drain regions being formed in a doped silicon semiconductor substrate with 90° transitions in the profile of the active areas with respect to said layout in critical locations where a said source/drain region is formed, said active areas having double back patterns crossing said wordline conductors at right angles thereto, with said double back patterns including transverse regions of said active areas parallel to said parallel wordline conductors located between said parallel wordline conductors where said active areas cross said parallel wordline conductors, a dielectric layer formed above said active areas, mesas formed in said silicon substrate between STI trench isolation regions with said mesas having edges, said STI trench isolation regions being filled with STI isolation material, said mesas being separated by said STI isolation material which is covered with the dielectric layer and with said dielectric layer covering edges of said mesas, at least one of said wordline conductors being composed of doped polysilicon formed above said active areas transverse to said active area, with a source/drain region formed in said critical locations in said active areas juxtaposed with at least one of said wordline conductors, said source/drain regions having sidewalls being formed along the <100> crystal plane with respect to said layout, and said contact to said source/drain region extending down through said dielectric layer to said source/drain region, with said contact being aligned with said mesas and isolated from a <110> silicon (Si) plane of said substrate by the STI isolation material and the dielectric layer.

8. The device of claim 7 wherein said sidewalls of said source/drain region are formed along the <100> crystal plane with respect to said layout.

9. The device of claim 7 wherein at least one of said parallel wordline conductors is formed of doped polysilicon.

10. The device of claim 7 wherein:

sidewalls of said source/drain region are formed along the <100> crystal plane with respect to said layout, and at least one of said parallel wordline conductors is formed of doped polysilicon.

11. The device of claim 7 wherein said semiconductor substrate comprises silicon.

12. The device of claim 7 wherein:

said semiconductor substrate comprises silicon, sidewalls of said source/drain regions are formed along the <100> crystal plane with respect to said layout, and at least one of said parallel wordline conductors is formed of doped polysilicon.

13. An SRAM device having a doped semiconductor substrate with STI trench isolation regions in said substrate filled with STI isolation material, with a preferred layout having source regions and drain regions formed in active areas, wordline conductors and contacts comprising:

mesas formed in said semiconductor substrate between said STI trench isolation regions, said active areas being formed in a doped silicon semiconductor substrate with 90° transitions in the profile of the active area in critical locations with respect to said layout where source regions are to be formed, a dielectric layer formed above said active areas, said mesas being separated by the STI isolation material which is covered with the dielectric layer and with said dielectric layer covering edges of said mesas, at least one of said wordline conductors being composed of doped polysilicon formed above said active areas transverse to said active areas, with source regions formed in said critical locations in said active areas juxtaposed with at least one of said wordline conductors to form pass gate transistors with drain regions in said active areas juxtaposed with at least one of said wordline conductors on the opposite side from said source regions to form pass gate transistors and with said active are as having double back patterns where,said active areas cross said wordline conductors, said source regions having sidewalls, said sidewalls of said source regions being formed along a <100> crystal plane with respect to said layout, each of said contacts to said source regions and said drain regions is formed adjacent to at least one of said wordline conductors extending down through said dielectric layer to at least one of said source regions and at least one of said drain regions respectively, said contacts being aligned with said mesas and isolated from a <110> silicon (Si) plane of said substrate by the STI isolation material and the dielectric layer, and said source regions and said drain regions having similar sizes and shapes.

14. The device of claim 13 wherein said sidewalls of said source regions are formed along the <100> crystal plane with respect to said layout.

15. The device of claim 13 wherein at least one of said wordline conductors is formed of doped polysilicon.

16. The device of claim 13 wherein sidewalls of said source regions are formed along the <100> crystal plane with respect to said layout, and at least one of said wordline conductors is formed of doped polysilicon.

17. The device of claim 13 wherein said semiconductor substrate comprises silicon.

18. The device of claim 13 wherein:

said semiconductor substrate comprises silicon, said sidewalls of said source regions are formed along the <100> crystal plane with respect to said layout, and at least one of said wordline conductors is formed of doped polysilicon.

19. A semiconductor SRAM device having source regions, drain regions formed in active areas, a pair of parallel wordline conductors and contacts comprising:

the active areas being formed in a doped semiconductor substrate with a layout with 90° transitions in the profile of at least one of the active areas in critical locations where source regions are to be formed, mesas formed in the silicon substrate between STI trench isolation regions filled with STI isolation material, said active areas having double back patterns crossing said pair of parallel wordline conductors at right angles thereto, with said double back patterns including transverse regions of said active areas parallel to said pair of parallel wordline conductors located between said pair of parallel wordline conductors where said active areas cross said pair of parallel wordline conductors, a dielectric layer formed above active areas, the mesas being separated by the STI isolation material which is covered with the dielectric layer and with said dielectric layer covering edges of said mesas, the contacts being aligned with the mesas and isolated from the substrate by the STI isolation material and the dielectric layer, and the contacts to the drain regions being formed extending down from at least one of said pair of parallel wordline conductors through the dielectric layer to the drain regions.

20. The device of claim 19 wherein the substrate has <100> and <110> crystal planes and with respect to a layout, sidewalls of the source regions are formed along the <100> crystal plane.

21. The device of claim 19 wherein at least one of the wordline conductors is formed of doped polysilicon.

22. The device of claim 19 wherein:

the substrate has <100> and <110> crystal planes, with respect to a layout, sidewalls of the source regions are formed along the <100> crystal plane, and at least one of the wordline conductors is formed of doped polysilicon.

23. The device of claim 19 wherein the semiconductor substrate comprises silicon.

24. The device of claim 19 wherein:

the semiconductor substrate comprises silicon, the substrate has <100> and <100> crystal planes, with respect to a layout, sidewalls of the source regions and drain regions are formed along the <100> crystal plane, and at least one of the parallel wordline conductors is formed of doped polysilicon.

* * * * *